United States Patent
Kuribara

(10) Patent No.: US 6,326,798 B1
(45) Date of Patent: Dec. 4, 2001

(54) ELECTRIC BEAM TESTER AND IMAGE PROCESSING APPARATUS

(75) Inventor: Masayuki Kuribara, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/451,854

(22) Filed: Dec. 1, 1999

(30) Foreign Application Priority Data

Dec. 1, 1998 (JP) .................................................. 10-342227

(51) Int. Cl.$^7$ .................................................. G01R 31/28
(52) U.S. Cl. ...................... 324/751; 324/158.1; 324/501; 250/310; 250/311
(58) Field of Search .................................... 324/751, 752, 324/158.1, 501; 250/310, 311

(56) References Cited

U.S. PATENT DOCUMENTS

| | | | |
|---|---|---|---|
| 4,912,328 | * 3/1990 | Kato et al. | 250/310 |
| 5,029,250 | * 7/1991 | Komatsu et al. | 250/310 |
| 5,093,616 | * 3/1992 | Seitoh et al. | 324/158.1 |
| 5,521,517 | * 5/1996 | Shida et al. | 324/751 |
| 5,589,780 | * 12/1996 | Ueda et al. | 324/751 |
| 5,592,099 | * 1/1997 | Kuribara et al. | 324/751 |
| 5,633,595 | * 5/1997 | Ueda et al. | 324/751 |
| 5,659,174 | * 8/1997 | Kaneoka et al. | 250/310 |
| 5,986,263 | * 11/1999 | Hiroi et al. | 250/310 |
| 6,078,183 | * 6/2000 | Cole, Jr. | 324/752 |

* cited by examiner

*Primary Examiner*—Safet Metjahic
*Assistant Examiner*—Jimmy Nguyen
(74) *Attorney, Agent, or Firm*—Rosenthal & Osha L.L.P.

(57) ABSTRACT

An electric beam tester tests an electric component with a signal generating apparatus which provides a signal to the electric component. An electric gun scans an electric beam on the electric component. The electric component is provided with the signal by the signal generating apparatus. A detector detects secondary electrons radiated from the electric component by irradiating the electric beam on the electric component. An image generating element generates a scanned image that shows a change of electric potential in the electric component with time using the secondary electrons detected by the detector. A selecting element selects a part of an image of the scanned image by selecting a time range in the scanned image. A correcting element corrects the scanned image using the part of The image selected by the selecting element.

16 Claims, 4 Drawing Sheets

ELECTRIC BEAM TESTER AND IMAGE PROCESSING APPARATUS

This patent application claims priority based on a Japanese patent application, H10-342227 filed on Dec. 1, 1998, the contents of which are incorporated herein by reference.

BACKGROUND OF THE INVENTION

1. Field of the Invention

The present invention relates to an electric beam tester which tests electric components such as a semiconductor. In particular, the present invention relates to an electric beam tester which has a means of correcting an image scanned by an electric beam.

2. Description of the Related Art

If a magnetic field is generated in an electric component, which is an object being measured by an electric beam tester, an error is generated at the landing point of the primary electron. Distortion therefore occurs in the measuring results of the voltage waveform. To correct this distortion, Logic State Mapping image, LSM image is used. The LSM image is an image obtained by providing a test pattern to electric components such as semiconductors and at the same time scanning the electric components. The error of the landing point of the primary electron can be measured by measuring the change of the LSM image with time. By previously measuring the error of the landing point of the primary electrons, the necessary correction can be made to each phase of the test signal, even in the case of measuring the voltage waveform of the electric component.

FIG. 1 shows an example of the LSM image. It is desirable to automatically calculate the magnitude of the landing point error of the primary electron based on the LSM image. However, there is an area in the LSM image in which the secondary electron is not detected as shown in the black areas in FIG. 1. Furthermore, because a pattern or wiring such as GND and power supply, are cut off in the upper and lower edges of the LSM image, it is difficult to calculate the degree of deviation just using the simple operation method. Additionally, because the signal to noise ratio, SN ratio, of the LSM image data is low, it is difficult to calculate the degree of deviation just using the simple operation method. Therefore, it is difficult to automatically calculate the magnitude of the landing point error of the primary electron.

Thus, the operator of the electric beam tester detects the degree of deviation by referring to the LSM image, and corrects the landing point of the primary electrons according to the degree of deviation. Therefore, the problem can occur where the degree of deviation cannot be accurately detected, and a complicated operation has to be undertaken for the correction.

SUMMARY OF THE INVENTION

Therefore, it is an object of the present invention to provide an electric beam tester which can overcomes the above issues in the related art. This object is achieved by combinations described in the independent claims. The dependent claims define further advantageous and exemplary combinations of the present invention.

According to the first aspect of the present invention, an electric beam tester which tests an electric component can be provided. The electric beam tester comprises a signal generating apparatus which provides a signal to the electric component; an electric gun which scans an electric beam onto the electric component to which the signal generated by the signal generating apparatus is provided; a detector which detects secondary electrons radiated from the electric component, by irradiating the electric beam onto the electric component; an image generating means which generates a scanned image of the electric component using the secondary electrons detected by the detector; a selecting means which selects a part of an image of the scanned image generated by the image generating means; and a correcting means which corrects the scanned image using the part of an image selected by the selecting means.

According to the second aspect of the present invention, an image processing apparatus, which processes a scanned image is provided. This scanned image is obtained by scanning an electric beam on a specific straight line in an electric component to which a signal is provided from a signal generating apparatus. The scanned image may show an electric potential on the specific straight line within a prescribed time range. The image processing apparatus may comprise a selecting means which selects a range of the straight line and time range in the scanned image; and a correcting means which corrects the entire scanned image so that changes over time in an image selected by the selecting means decreases.

The scanned image may show a change of electric potential in the electric component over time; and the selecting means may select a time range in the scanned image. The scanned image may show a change of electric potential over time on a specific straight line in the electric component; and the selecting means may select a prescribed range on the straight line. The selecting means may select the part of an image from a plurality of places. In this case, the part of an image may be selected from a plurality of places so that at least an image of one area is selected at all times.

The correcting means may correct the entire scanned image so that any change over time in the part of an image selected by the selecting means decreases. The image processing apparatus may further comprise a display device which displays the scanned image corrected by the correcting means. The selecting means may select as the part of an image, an image from the scanned image of an area having a greater level of contrast than a prescribed reference value in the scanned image, and an image nearby this selected area.

The selecting means may select as the part of an image an image of an area where secondary electrons greater than a prescribed reference value are detected in the scanned image, and an image nearby the selected image. The image processing apparatus may further comprise a display device which displays the scanned image generated by the image generating means; wherein the selecting means may select as the part of an image, a region designated by a user within a region of the scanned image displayed in the display device.

This summary of the invention does not necessarily describe all necessary features so that the invention may also be a sub-combination of these described features.

DETAILED DESCRIPTION OF THE INVENTION

The invention will now be described based on the preferred embodiments, which do not intend to limit the scope of the present invention, but exemplify the invention. All of the features and combinations thereof described in the embodiment are not necessarily essential to the invention.

Figure 2:
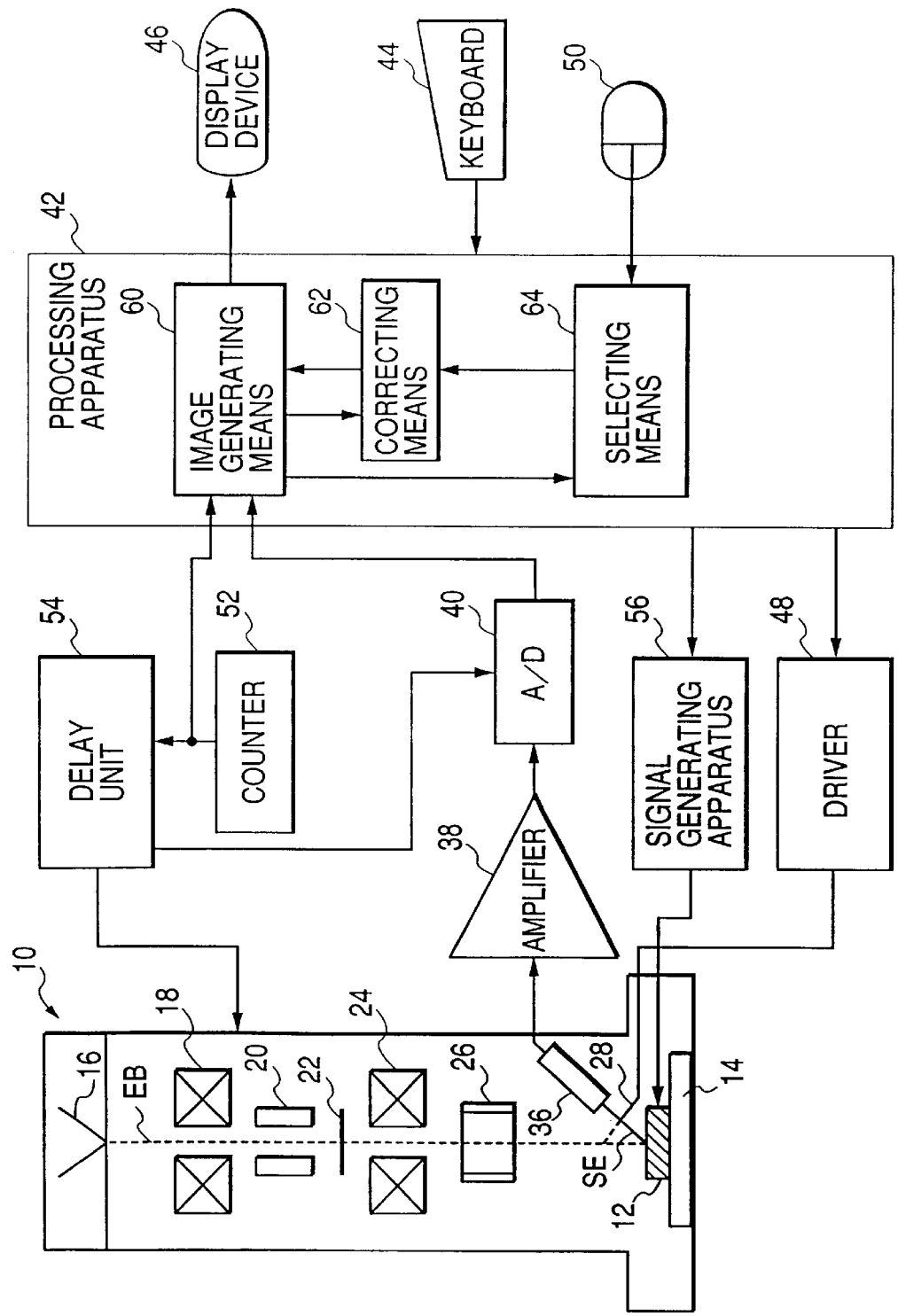
FIG. 2 shows a block diagram of configuration of an electric beam tester.

FIG. 2 shows a block diagram of a configuration of an electric beam tester. The electric beam tester of the present invention has a signal generating apparatus 56, an electric gun 16, a detector 36, and a processing apparatus 42. The signal generating apparatus 56 provides a signal to an electric component 12. The electric gun 16 scans an electric beam onto the electric component 12 to which a signal generated by the signal generating apparatus 56 is provided. The detector 36 detects secondary electrons, which are radiated from the electric component 12 by irradiating the electric component 12 using an electric beam. The processing apparatus 42 generates and processes a scanned image of the electric components 12 using secondary electrons detected by the detector 36.

The electric component 12 is mounted on a stage 14 inside an electric beam cylinder 10. An electric beam EB radiated from an electric gun 16 is irradiated to the electric components 12 on the stage 14 through a magnetic field lens 18, a polarizing plate for pulsating 20, an aperture for pulsating 22, a magnetic field lens 24, a polariscope 26, an analyzing grid 28, and an objective lens 34. An analyzing voltage is applied to the analyzing grid 28 by the driver 48. The secondary electrons SE radiated from the electric component 12 are detected by the detector 36. The detector 36 converts the signal quantity of the secondary electrons to a voltage value.

The voltage value generated by the detector 36 is amplified by the amplifier 38 and then converted to a digital signal by an A/D converter 40. The converted signal is then provided to a processing apparatus 42. A keyboard 44, a mouse 50 (as an example of a designating means), and a display device 46 are connected to the processing apparatus 42. The processing apparatus 42 controls a signal generating apparatus 56, and as a result of this control, the signal generating apparatus 56 provides a test signal to the electric components 12. The delay unit 54 controls the A/D converter 40 according to the count value provided from the counter 52 and irradiates the electric beam EB intermittently.

The processing apparatus 42 has an image generating means 60, a selecting means 64, and a correcting means 62. The image generating means 60 generates a scanned image using secondary electrons detected by the detector 36. The selecting means 64 selects a part of a scanned image generated from the image generating means 60. The correcting means 62 corrects the scanned image using the part of the image selected by the selecting means 64.

Figure 3:
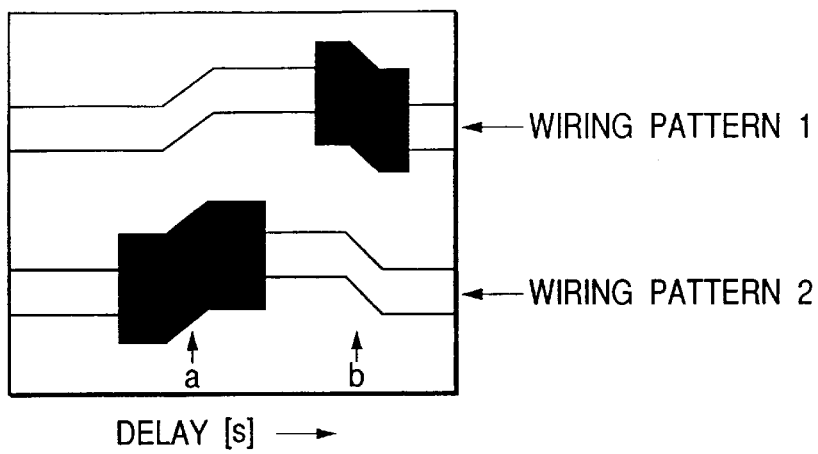
FIG. 3 shows an example of an image generated by the image generating means 60 and displayed by the display device 46.

FIG. 3 shows an example of an image generated by the image generating means 60 and displayed by the display device 46. Whilst providing the test signal to the electric component 12 using the signal generating apparatus 56, specific lines in the electric component 12 are scanned repeatedly by the electric beam EB. A scanned image, which shows changes of electric potential in the electric component 12 over time, can be obtained. If a magnetic field is generated on the electric component 12 as a result of the signal provided to the electric components 12, the course of the electric beam EB is distorted by the magnetic field. Therefore, the detector 36 detects secondary electrons SE at the position of deviation from the original position. In FIG. 3, the secondary electrons SE are detected as a deviated position during the time range "a" to "b".

When the electric potential of the wiring pattern is high, the quantity of secondary electrons emitted from and around the wiring pattern decreases due to the local electric field effect. In FIG. 3, the regions where secondary electrons are not detected by the local electric field effect are shown as black regions. In these black regions, it is difficult to specify the position of the wiring pattern in the electric component. Therefore, the selecting means 64 selects only the range where the position of the wiring pattern can be specified.

Figure 4:
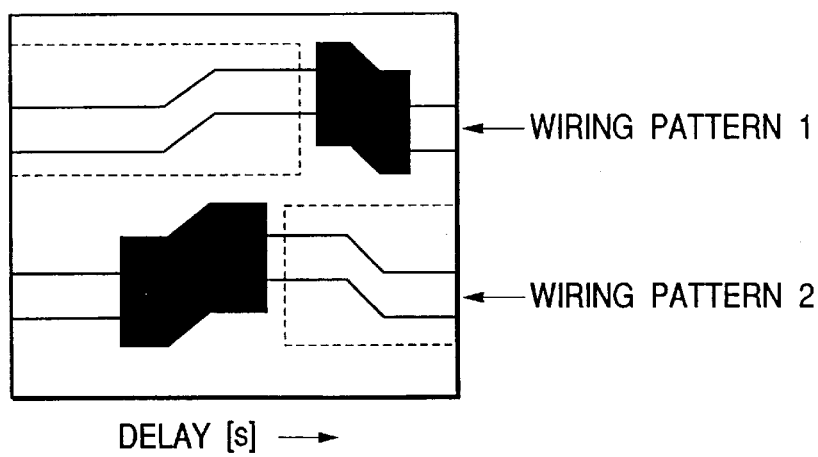
FIG. 4 shows a state when the selecting means 64 selects a part of an image in the scanned image.

FIG. 4 shows a state when the selecting means 64 selects a part of an image from the scanned image. In FIG. 4, images of two places having different time ranges and scanning line position ranges are selected. It is preferable that at least one area of the image is selected at all times. The selecting means 64 selects the image of an area where the level of contrast is greater than a prescribed reference value, and the image nearby the said part is selected automatically as a part of the image. As another embodiment, the selecting means 64 can select a part of the scanned image where secondary electrons greater than a prescribed reference value are detected, and the image nearby the said part as a part of the image.

When the user designates the prescribed region of the scanned image displayed in the display device 46 using the designating means 50, the selecting means 64 selects the region designated by the designating means 50 as a part of the image. Here, the operator can select the region where the wiring pattern can be observed properly using the designating means. In this way, if the operator selects the image, an image suitable for calculating the degree of deviation can be easily selected in the case where the SN ratio of the image data is so low that the selecting means 64 cannot automatically select the image.

The correcting means 62 corrects the entire scanned image so that the changes over time of the part of the image designated by the designating means 50 decreases, that is, the wiring pattern becomes almost a straight line. For example, the correcting means 62 shifts the reference image (which includes the wiring pattern) in the direction from where the deviation was generated within the prescribed time range in the part of the image selected by the selecting means 64. During the shifting of the reference image, the correcting means 62 calculates the correlation in the direction from where the deviation was generated, between said reference image and the image within the prescribed time range in said part of the image. The correcting means 62 thus is able to detect the degree of deviation of the wiring pattern in the prescribed time range.

Here, it can be judged that the area where the correlation is largest is the wiring pattern, and the degree of shifting of the reference image in that area becomes the degree of deviation of the wiring pattern. Furthermore, the correcting means 62 detects the degree of deviation of the wiring pattern by calculating the correlation shown above for other time ranges in that part of the image. Therefore, the degree of deviation of the wiring pattern in each time range of the part of the image can be detected.

Next, the correcting means 62 corrects the entire scanned image based on the detected degree of deviation in order to decrease the degree of deviation. Here, the image in the range where it can be judged that there is no deviation of the wiring pattern can be used as the reference image. The display device 46 displays the scanned image corrected by the correcting means 62. Then, when the electric beam is irradiated on the electric components12, the irradiating position of the electric beam is corrected based on the degree of deviation already detected.

Figure 5:
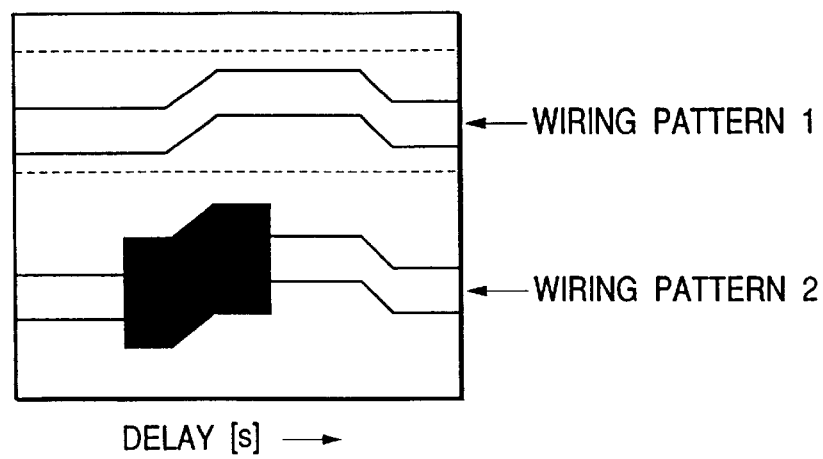
FIG. 5 shows a state when the selecting means 64 selects a part of an image in the scanned image.

FIG. 5 shows another example of the scanned image. As shown in this figure, when there is a wiring pattern which does not have a contrast of electric potential in the prescribed time range, the selecting means 64 selects the entire wiring pattern. Therefore, the scanned image can be corrected as shown in FIG. 4.

Figure 1:
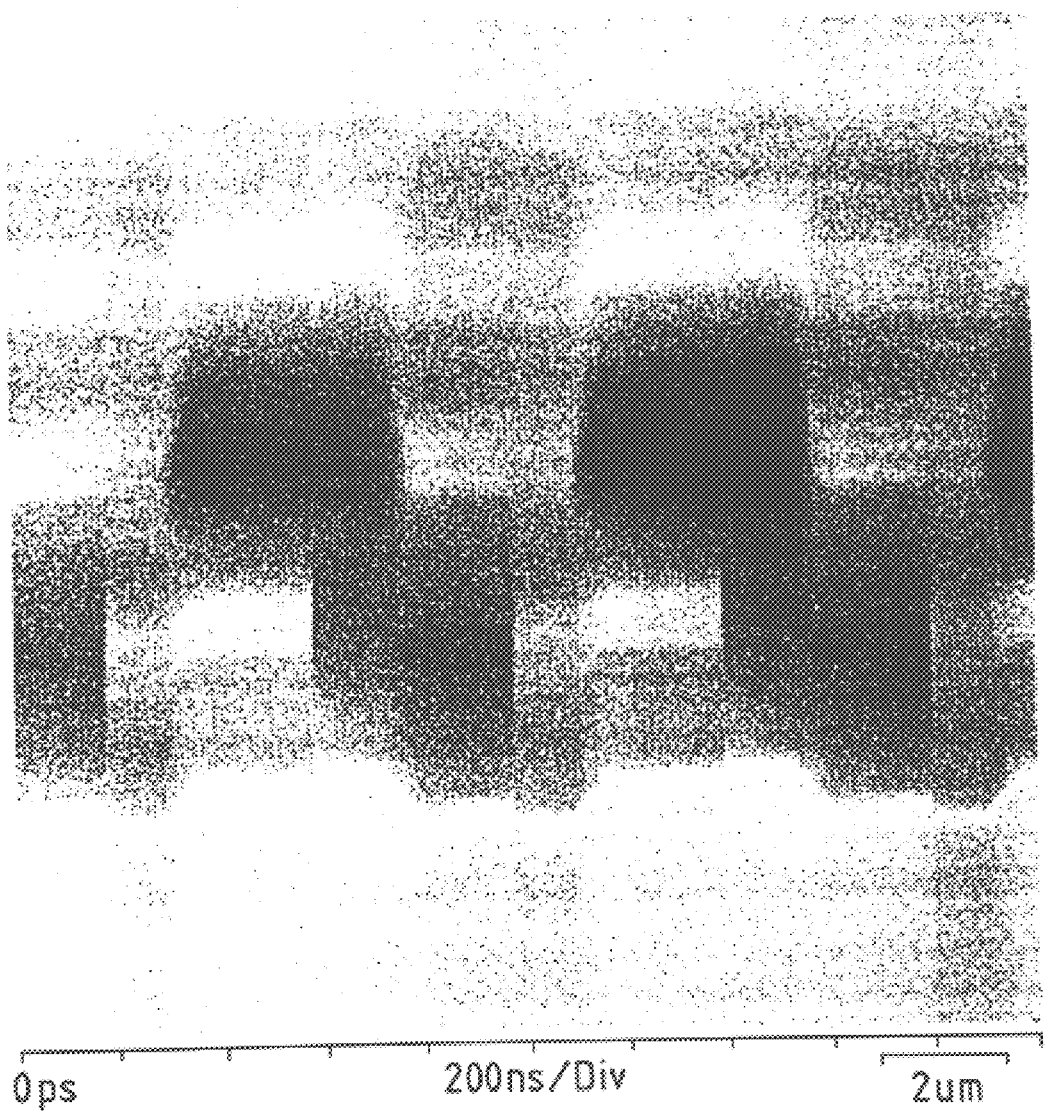
FIG. 1 shows an example of the Logic State Mapping image.
Figure 6:
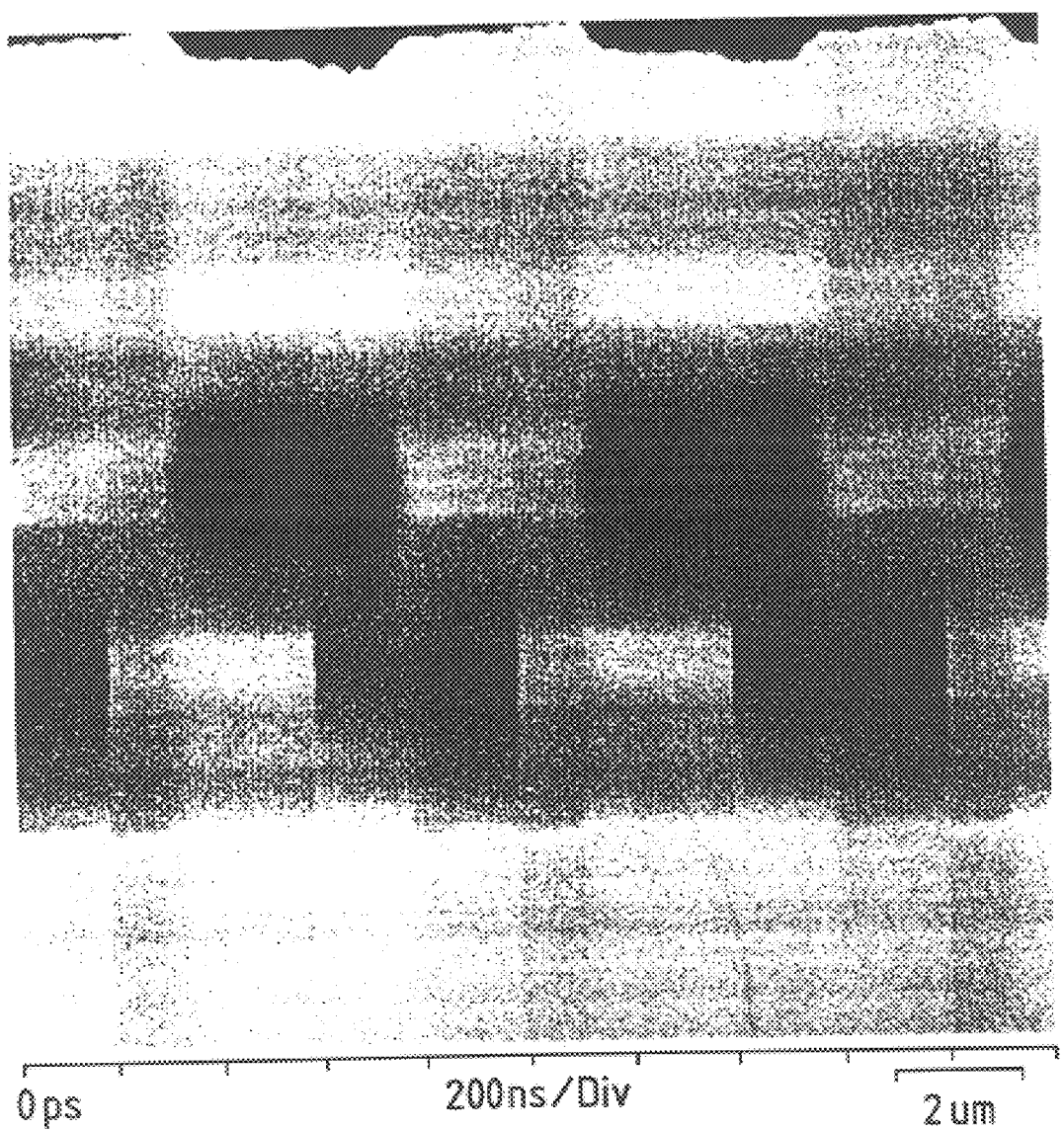
FIG. 6 shows the image obtained after correcting the scanned image shown in FIG. 1 using the correcting means 62.

FIG. 6 shows the image obtained by correcting the scanned image shown in FIG. 1 using the correcting means 62. As shown in FIG. 6, the distortion of the wiring pattern is removed, and the wiring pattern becomes almost a straight line.

In the embodiment shown above, the selecting means 64 selects a region, which is used for the correcting means 62 to correct the scanned image. In another embodiment, the selecting means 64 can select a region where the correcting means 62 should not be used for correcting the scanned image. The correcting means 62 can then correct the scanned image using the image of a region other than the region selected by the selecting means 64. The selecting means 64 selects a rectangular region in the above embodiments. In another embodiment, the selecting means 64 can select a region that is a curved shape.

As shown above, the influence of the electric potential occurring in the electric components can be easily removed by the present invention. Therefore, the voltage in the electric component can be promptly measured.

Although the present invention has been described by way of exemplary embodiments, it should be understood that many changes and substitutions may be made by those skilled in the art without departing from the spirit and the scope of the present invention which is defined only by the appended claims.

What is claimed is:

1. An electric beam tester which tests an electric component comprising:
    a signal generating apparatus which provides a signal to said electric component;
    an electric gun which scans an electric beam on said electric component, said electric component being provided with said signal by said signal generating apparatus;
    a detector which detects secondary electrons radiated from said electric component by irradiating said electric beam on said electric component;
    an image generating means which generates a scanned image that shows a change of electric potential in said electric component with time using said secondary electrons detected by said detector;
    a selecting means which selects a part of an image of said scanned image by selecting a time range in said scanned image; and
    a correcting means which corrects said scanned image using said part of an image selected by said selecting means.

2. An electric beam tester as claimed in claim 1, wherein said selecting means has a means of selecting said part of an image from a plurality of places.

3. An electric beam tester as claimed in claim 2, wherein said part of an image is selected from a plurality of places so that at least an image of one place is selected at all times.

4. An electric beam tester as claimed in claim 1, wherein:
    said scanned image shows a change of electric potential with time on a specific straight line in said electric component; and
    said selecting means further has a means of selecting a prescribed range on said straight line.

5. An electric beam tester as claimed in claim 4, wherein said correcting means corrects entire said scanned image so that change over time of said part of an image selected by said selecting means decreases.

6. An electric beam tester as claimed in claim 5 further comprising a display device which displays said scanned image corrected by said correcting means.

7. An electric beam tester as claimed in claim 5, wherein said selecting means has a means of selecting an image of a part having a level of contrast greater than a prescribed reference value in said scanned image and an image nearby said image of said part as said part of an image.

8. An electric beam tester as claimed in claim 5, wherein said selecting means has a means of selecting an image of a part where said secondary electrons greater than a prescribed reference value are detected in said scanned image and an image nearby said image of said part as said part of an image.

9. An electric beam tester as claimed in claim 5 further comprising:
    a display device which displays said scanned image generated by said image generating means; wherein
    said selecting means has a means of selecting a region designated by a user within a region of said scanned image displayed in said display device as said part of an image.

10. An image processing apparatus which processes a scanned image obtained by scanning an electric beam on a specific straight line in an electric component to which a signal is provided from a signal generating apparatus, wherein said scanned image shows an electric potential on said specific straight line in a prescribed time range; comprising:

a selecting means which selects a range of said straight line and time range in said scanned image; and a correcting means which corrects entire said scanned image so that change over time of said part of an image selected by said selecting means decreases.

11. An image processing apparatus as claimed in claim 10, wherein said selecting means has a means of selecting said part of an image from a plurality of places.

12. An image processing apparatus as claimed in claim 11, wherein said part of an image is selected from a plurality of places so that at least an image of one place is selected at all times.

13. An image processing apparatus as claimed in claim 10 further comprising a display device which displays said scanned image corrected by said correcting means.

14. An image processing apparatus as claimed in claim 10, wherein said selecting means has a means of selecting an image of a part having a level of contrast greater than a prescribed reference value in said scanned image and an image nearby said image of said part as said part of an image.

15. An image processing apparatus as claimed in claim 10, wherein said selecting means has a means of selecting an image of a part where said secondary electrons greater than a prescribed reference value are detected in said scanned image and an image nearby said image of said part as said part of an image.

16. An image processing apparatus as claimed in claim 10 further comprising:

a display device which displays said scanned image generated by said image generating means; wherein;

said selecting means has a means of selecting a region designated by an user within a region of said scanned image displayed in said display device as said part of an image.

* * * * *